(12) United States Patent
Suwada

(10) Patent No.: US 9,563,221 B2
(45) Date of Patent: Feb. 7, 2017

(54) SEMICONDUCTOR DEVICE AND METHOD FOR SETTING VOLTAGE IN SEMICONDUCTOR DEVICE

(71) Applicant: FUJITSU LIMITED, Kawasaki-shi, Kanagawa (JP)

(72) Inventor: Makoto Suwada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/059,741

(22) Filed: Mar. 3, 2016

(65) Prior Publication Data

US 2016/0291628 A1 Oct. 6, 2016

(30) Foreign Application Priority Data

Apr. 1, 2015 (JP) ................. 2015-074989

(51) Int. Cl.
*G11C 5/14* (2006.01)
*G05F 3/16* (2006.01)
*H01L 23/498* (2006.01)

(52) U.S. Cl.
CPC ........... *G05F 3/16* (2013.01); *H01L 23/49827* (2013.01)

(58) Field of Classification Search
CPC .......... G11C 5/147; G05F 1/465; G05F 3/205; G05F 3/262; H04B 1/1623; H03H 11/245; H03H 11/24; H03K 17/693; H03G 1/0088; H03G 1/007
USPC ................................. 327/530, 308
See application file for complete search history.

(56) References Cited

U.S. PATENT DOCUMENTS

| | | | | |
|---|---|---|---|---|
| 6,466,077 | B1 * | 10/2002 | Miyazaki | ............... G05F 3/205 326/33 |
| 2013/0016477 | A1 | 1/2013 | Yokoya et al. | |
| 2013/0093492 | A1 * | 4/2013 | Riho | ................ H03K 19/01852 327/333 |

(Continued)

FOREIGN PATENT DOCUMENTS

JP 2014-523141 9/2014

OTHER PUBLICATIONS

Joungho Kim, "Signal Integrity Modeling and Measurement of TSV in 3D IC", Terahertz Interconnection and Package Laboratory ppl-43, 2013 and Abstract.

*Primary Examiner* — Quan Tra
(74) *Attorney, Agent, or Firm* — Staas & Halsey LLP

(57) ABSTRACT

A semiconductor device includes a substrate; a first through-electrode penetrating the substrate and connected to a power source or a reference potential point; a second through-electrode penetrating the substrate; a power section connected between the substrate and the second through-electrode and configured to output a DC voltage between the substrate and the second through-electrode; a voltage control section configured to control the DC voltage to be output by the power section; and a measurement section connected to the first through-electrode and configured to measure a power impedance of the first through-electrode, wherein the voltage control section is configured to control a value of the DC voltage output by the power section, such that the power impedance of the first through-electrode measured by the measurement section is equal to or less than a predetermined value within a predetermined frequency range including a frequency of noise occurring in the first through-electrode.

8 Claims, 13 Drawing Sheets

(56) References Cited

U.S. PATENT DOCUMENTS

| | | | |
|---|---|---|---|
| 2014/0188409 A1* | 7/2014 | Cordero | G01R 31/31851 702/58 |
| 2014/0208279 A1* | 7/2014 | Bhawmik | G01R 31/2853 716/106 |
| 2016/0020268 A1* | 1/2016 | Suwada | H01L 21/76898 257/532 |
| 2016/0161968 A1* | 6/2016 | Kim | G05F 3/02 365/226 |

* cited by examiner

FIG. 6

| UPPER LIMIT OF VOLTAGE VALUE | $V_{max}$ |
|---|---|
| LOWER LIMIT OF VOLTAGE VALUE | $V_{min}$ |

FIG. 13

| $V_{bias}$ | $C_{depl}$ |
|---|---|
| $V_{bias}1$ | $C_{depl}1$ |
| $V_{bias}2$ | $C_{depl}2$ |
| $V_{bias}3$ | $C_{depl}3$ |
| ⋮ | ⋮ |

SEMICONDUCTOR DEVICE AND METHOD FOR SETTING VOLTAGE IN SEMICONDUCTOR DEVICE

CROSS-REFERENCE TO RELATED APPLICATION

This application is based upon and claims the benefit of priority of the prior Japanese Patent Application No. 2015-074989, filed on Apr. 1, 2015, the entire contents of which are incorporated herein by reference.

FIELD

The embodiments discussed herein are related to a semiconductor device and a method for setting a voltage in the semiconductor device.

BACKGROUND

There has heretofore been an interposer constructing a capacitor by using a dielectric sleeve to insulate GND planes on top and bottom surfaces of the interposer from through-silicon via (TSV) core metal (see, for example, Paragraph 0033 and FIG. 7 in Japanese Laid-open Patent Publication No. 2014-523141).

Since the capacitor in the conventional interposer is formed of the GND planes on the top and bottom surfaces of the interposer and the TSV core metal, capacitance of the capacitor is set to a fixed value determined by a physical configuration.

Thus, it is difficult to set the capacitance flexibly depending on electrical characteristics such as an operating frequency or an operating voltage of an electronic component mounted on the interposer, manufacturing variations thereof, or the like, for example. Therefore, the quality of the power source may be deteriorated.

Therefore, it is an object of the embodiments to provide a semiconductor device capable of good-quality power supply, and a method for setting a voltage in the semiconductor device.

SUMMARY

According to an aspect of the embodiments, a semiconductor device includes a substrate; a first through-electrode penetrating the substrate and connected to a power source or a reference potential point; a second through-electrode penetrating the substrate; a power section connected between the substrate and the second through-electrode and configured to output a DC voltage between the substrate and the second through-electrode; a voltage control section configured to control the DC voltage to be output by the power section; and a measurement section connected to the first through-electrode and configured to measure a power impedance of the first through-electrode, wherein the voltage control section is configured to control a value of the DC voltage output by the power section, such that the power impedance of the first through-electrode measured by the measurement section is equal to or less than a predetermined value within a predetermined frequency range including a frequency of noise occurring in the first through-electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is a diagram illustrating voltage value data;

FIG. 13 is a diagram illustrating data stored in a database.

DESCRIPTION OF EMBODIMENTS

Hereinafter, description is given of embodiments to which a semiconductor device and a method for setting a voltage in the semiconductor device according to the present disclosure are applied.

Figure 1:
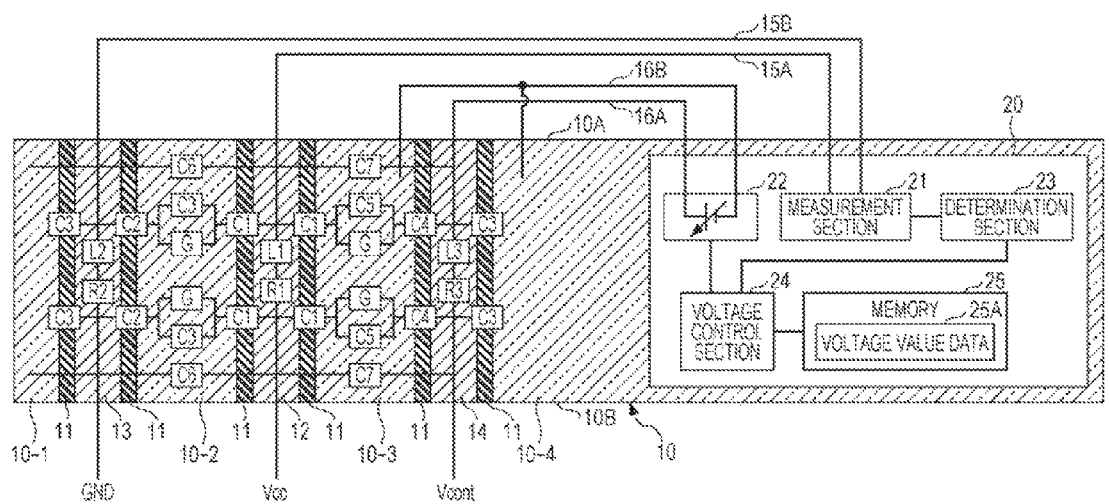
FIG. 1 is a cross-sectional view illustrating a semiconductor device according to Embodiment 1.

FIG. 1 is a cross-sectional view illustrating a semiconductor device 1 according to Embodiment 1.

The semiconductor device 1 illustrated in FIG. 1 includes a substrate 10, an insulating layer 11, through-vias 12, 13 and 14, wires 15A, 15B, 16A and 16B, and a control section 20.

Although FIG. 1 illustrates the substrate 10, the insulating layer 11, the through-vias 12, 13 and 14, the wires 15A, 15B, 16A and 16B, and the control section 20 as constituent elements of the semiconductor device 1, the semiconductor device 1 may include any other constituent elements.

For example, the semiconductor device 1 may include an electronic circuit, an arithmetic processing unit or the like, including metal oxide silicon (MOS) transistors. In such a case, the semiconductor device 1 is a large scale integration (LSI) circuit (semiconductor integrated circuit).

Also, for example, the semiconductor device 1 may be an electronic component, like an interposer, which has an LSI chip mounted thereon, such as a field-programmable gate array (FPGA).

In either case, the semiconductor device 1 supplies power to an electronic circuit, an electronic component or the like connected to a power system constructed by the through-vias 12 and 13.

As the substrate 10, a semiconductor substrate such as silicon (Si) or germanium (Ge) may be used, for example.

The substrate 10 may have impurities injected therein to have a P-type or N-type conductivity depending on the intended use of the semiconductor device 1.

Moreover, as the substrate 10, a compound semiconductor substrate such as silicon germanium (SiGe), silicon carbide (SiC) and gallium nitride (GaN) may be used. The substrate 10 has principal surfaces 10A and 10B.

Here, for convenience of explanation, the substrate 10 may be divided into substrate sections 10-1, 10-2, 10-3 and 10-4. The substrate sections 10-1, 10-2, 10-3 and 10-4 are a part of the substrate 10, which are separated by the insulating layer 11 and the through-vias 12, 13 and 14 in the cross-section illustrated in FIG. 1, but are connected and integrated in a plan view. The substrate sections 10-1, 10-2, 10-3 and 10-4 are simply referred to as the substrate 10 when not particularly distinguished from each other.

Between the substrate sections 10-1, 10-2, 10-3, and 10-4, the insulating layers 11 are provided in through-holes penetrating in a thickness direction between the principal surfaces 10A and 10B of the substrate 10. The insulating layers 11 are provided to insulate the through-vias 12, 13 and 14 from the substrate 10. When the substrate 10 is a silicon substrate, silicon oxide ($SiO_2$) layers may be used, for example, as the insulating layers 11. The silicon oxide layers may be formed by depositing silicon oxide layers inside the through-holes or by injecting oxygen into the silicon substrate, for example.

Between the substrate sections 10-2 and 10-3, the through-via 12 is provided in the through-hole penetrating in the thickness direction between the principal surfaces 10A and 10B of the substrate 10. The sides of the through-via 12 are covered with the insulating layers 11 and thus insulated from the substrate 10. The through-via 12 is maintained at a power source (Vcc) potential. Also, the through-via 12 is connected to a measuring section 21 in the control section 20 by the wire 15A.

Between the substrate sections 10-1 and 10-2, the through-via 13 is provided in the through-hole penetrating in the thickness direction between the principal surfaces 10A and 10B of the substrate 10. The sides of the through-via 13 are covered with the insulating layers 11 and thus insulated from the substrate 10. The through-via 13 is maintained at a ground (GND) potential. Also, the through-via 13 is connected to the measuring section 21 in the control section 20 by the wire 15B. The through-vias 12 and 13 are an example of a first through-electrode.

The through-vias 12 and 13 construct a power system to supply power to transistors, electronic components or the like on various electronic circuits, which is formed inside the semiconductor device 1 or connected to the outside of the semiconductor device 1.

Between the substrate sections 10-3 and 10-4, the through-via 14 is provided in the through-hole penetrating in the thickness direction between the principal surfaces 10A and 10B of the substrate 10. The sides of the through-via 14 are covered with the insulating layers 11 and thus insulated from the substrate 10.

The through-via 14 is connected to a variable power section 22 in the control section 20 by the wire 16A, and a potential Vcont of the through-via 14 is controlled by the control section 20. The through-via 14 is an example of a second through-electrode.

The through-vias 12, 13 and 14 as described above may be formed, for example, by forming through-holes in the substrate 10 to form the insulating layers 11, forming through-holes corresponding to the through-vias 12, 13, and 14 in the insulating layers 11, and then filling the through-holes formed in the insulating layers 11 with plated layers by non-electrolytic plating and electrolytic plating. As the plated layers, copper plated layers may be formed, for example.

The through-vias 12, 13 and 14 as described above are through-silicon vias (TSVs). Note that, here, description is given of the embodiment in which the through-vias 12, 13 and 14 are the TSVs. However, the through-vias 12, 13, and 14 may be vias other than the so-called TSVs. The through-vias 12, 13, and 14 may be vias penetrating a semiconductor layer laminated on the substrate 10, rather than the substrate 10 typified by the silicon substrate.

Since the through-vias 12, 13 and 14 are connected to the substrate 10 through the insulating layers 11, there is a parasitic capacitance between the substrate 10 and each of the through-vias 12, 13 and 14.

The parasitic capacitances are schematically illustrated as C1 to C7 in FIG. 1. Also, each of the through-vias 12, 13 and 14 is formed using a conductor, and thus has a resistance component and an inductance component. In FIG. 1, the resistance components and inductance components of the through-vias 12, 13 and 14 are schematically illustrated as R1, L1, R2, L2, R3 and L3, respectively.

Moreover, it is assumed that there are conductors such as wires or electrodes maintained at the ground potential, as an example, in the substrate sections 10-2 and 10-3, and the conductors maintained at the ground potential are schematically illustrated as G.

In FIG. 1, electrical connections among the parasitic capacitances C1 to C7, the resistance components R1, R2, and R3, the inductance components L1, L2, and L3 and the conductors G at the ground potential are indicated by solid lines.

The wire 15A connects the through-via 12 to the measuring section 21 in the control section 20. The wire 15B connects the through-via 13 to the measuring section 21 in the control section 20. The wire 16A connects the through-via 14 to a positive terminal of the variable power section 22 in the control section 20. The wire 16B connects the substrate sections 10-3 and 10-4 to a negative terminal of the variable power section 22 in the control section 20.

For convenience of explanation, in FIG. 1, the wires 15A, 15B, 16A and 16B are separated from the principal surface 10A of the substrate 10. However, as the wires 15A, 15B, 16A and 16B, metal wires patterned on the principal surface 10A are available, for example.

Note that such metal wires may be formed on the principal surface 10B or may be formed on an inner layer of the substrate 10. Also, the wires 15A, 15B, 16A and 16B may be made of metal such as copper or aluminum, for example.

The control section 20 includes the measuring section 21, the variable power section 22, a determination section 23, a voltage control section 24 and a memory 25.

The measuring section 21 is connected to the through-vias 12 and 13 through the wires 15A and 15B, respectively. The through-vias 12 and 13 are connected to a power layer (V plane) and a ground layer (G plane) provided on the substrate 10 as the power system.

The measuring section 21 measures frequency characteristics of power impedance of the through-vias 12 and 13, the power layer (V plane) and the ground layer (G plane). To be more specific, the measuring section 21 measures the power impedance by measuring reflection coefficients (S parameter) at the through-vias 12 and 13 while outputting a sine-wave signal and sweeping the frequency of the sine-wave signal.

Therefore, the measuring section 21 may include, for example: a signal source configured to output a sine-wave signal having a variable frequency; a measurement section configured to measure input power and output power from current values and voltage values of the through-vias 12 and 13; and an arithmetic section configured to obtain the S parameter from the current values and voltage values measured by the measurement section, and to obtain the power impedance from the S parameter.

The variable power section 22 applies a DC voltage between the through-via 14 and each of the substrate sections 10-3 and 10-4 through the wires 16A and 16B. The variable power section 22 is an example of the power section, and is a variable direct current (DC) power having an output voltage value controlled by the voltage control section 24.

The variable power section 22 controls capacity the value of the parasitic capacitance between the through-via 14 and each of the substrate sections 10-3 and 10-4 by changing the potential of the through-via 14 with respect to the substrate sections 10-3 and 10-4.

The determination section 23 determines whether the value of the power impedance measured by the measuring section 21 exceeds a predetermined upper limit. The determination section 23 transmits a signal indicating the determination result to the voltage control section 24.

The voltage control section 24 controls the output voltage value of the variable power section 22 based on the signal indicating the determination result from the determination section 23 and data stored in the memory 25.

The memory 25 stores a database used by the voltage control section 24 to control the output voltage value of the variable power section 22. As for the memory 25, a non-volatile memory may be used, for example. The memory 25 stores voltage value data 25A indicating a range within which the voltage control section 24 may adjust the output voltage value of the variable power section 22.

The range within which the output voltage value may be adjusted is specified by the upper limit and lower limit. Note that an intermediate value between the upper limit and lower limit of the range corresponds to an intermediate value of the capacity value of the through-via 14.

Note that the control section 20 including the measuring section 21, the variable power section 22, the determination section 23, the voltage control section 24 and the memory 25 as described above may be formed on the substrate 10 by using semiconductor manufacturing technology.

Figure 2:
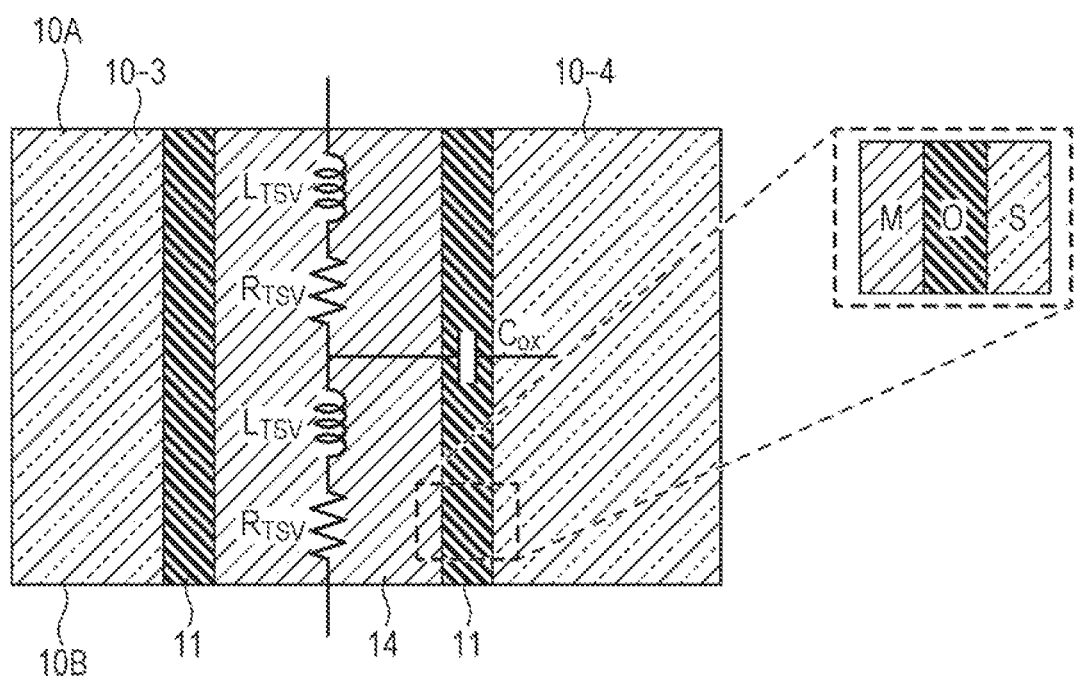
FIG. 2 is an enlarged view around a through-via in FIG. 1.
Figure 3:
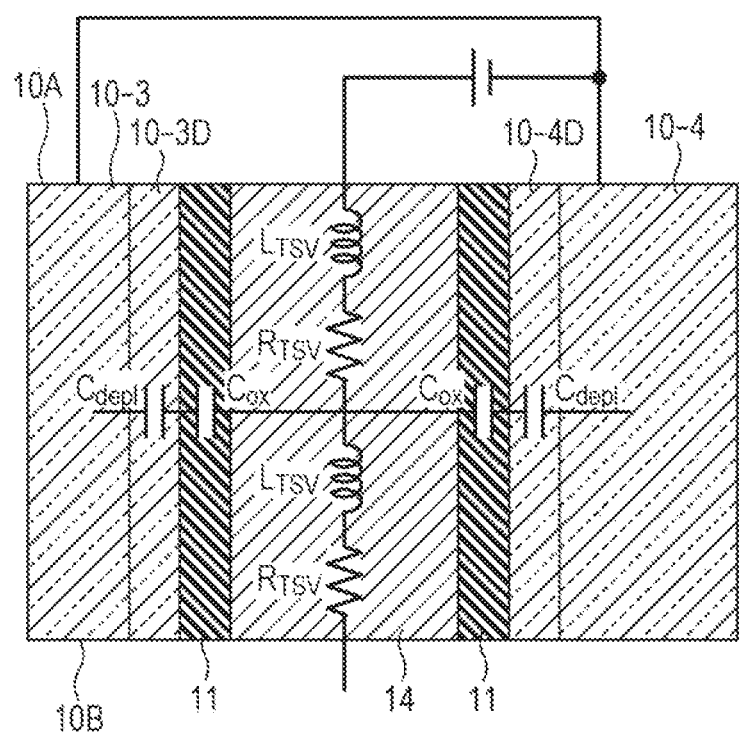
FIG. 3 is an enlarged view around the through-via in FIG. 1.

FIG. 2 is an enlarged view around the through-via 14 in FIG. 1, illustrating a state before application of a bias voltage between the through-via 14 and each of the substrate sections 10-3 and 10-4. FIG. 3 is an enlarged view around the through-via 14 in FIG. 1, illustrating a state during application of the bias voltage between the through-via 14 and each of the substrate sections 10-3 and 10-4.

FIGS. 2 and 3 illustrate the substrate sections 10-3 and 10-4, the insulating layers 11, the through-via 14, two $L_{TSV}$ as inductance components of the through-via 14, and two $R_{TSV}$ as resistance components. It is also assumed that a capacity component of the insulating layer 11 between the through-via 14 and the substrate section 10-4 is $C_{OX}$.

The two $L_{TSV}$ and the two $R_{TSV}$ are connected in series in the order of $L_{TSV}$, $R_{TSV}$, $L_{TSV}$ and $R_{TSV}$ between the end of the through-via 14 on the principal surface 10A side and the end thereof on the principal surface 10B side. Moreover, the capacity component $C_{OX}$ is connected to a branch point located at a midpoint of the series circuit of $L_{TSV}$, $R_{TSV}$, $L_{TSV}$ and $R_{TSV}$.

As illustrated in FIG. 2, the through-via 14, the insulating layers 11 and the substrate section 10-4 form a MOS structure. The same applies to the through-via 14, the insulating layers 11 and the substrate section 10-3.

As illustrated in FIG. 2, when the bias voltage is applied as illustrated in FIG. 3 from the state before the application of the bias voltage between the through-via 14 and each of the substrate sections 10-3 and 10-4, depletion layers 10-3D and 10-4D are generated in the substrate sections 10-3 and 10-4, respectively. Since the depletion layers 10-3D and 10-4D are regions where carriers are depleted and hardly any carriers exist, parasitic capacitances $C_{depl}$ are generated.

Therefore, as illustrated in FIG. 3, when the bias voltage is applied between the through-via 14 and each of the substrate sections 10-3 and 10-4, a total capacity C takes a value expressed in Equation (1) as follows:

$$C = \frac{C_{ox} \cdot C_{depl}}{C_{ox} + C_{depl}} \tag{1}$$

As described above, when the bias voltage is applied between the through-via 14 and each of the substrate sections 10-3 and 10-4, the total value C of the parasitic capacitance between the through-via 14 and each of the substrate sections 10-3 and 10-4 changes. The thickness of the depletion layers 10-3D and 10-4D is increased with increase in bias voltage and decreased with reduction in bias voltage.

The total capacity C expressed in Equation (1) is obtained by connecting the capacity component $C_{OX}$ of the insulating layer 11 and the parasitic capacitance $C_{depl}$ of the depletion layer 10-3D or 10-4D in series, and thus is larger than the capacity component $C_{OX}$ of the insulating layer 11.

Also, when the bias voltage is increased, the thickness of the depletion layers 10-3D and 10-4D is increased and the parasitic capacitance $C_{depl}$ is increased. Thus, the total capacity C is increased.

In other words, when the bias voltage is increased, the total capacity C between the through-via 14 and each of the substrate sections 10-3 and 10-4 is increased. On the other hand, when the bias voltage is decreased, the total capacity C between the through-via 14 and each of the substrate sections 10-3 and 10-4 is decreased.

As described above, when the total capacity C between the through-via 14 and each of the substrate sections 10-3 and 10-4 changes, the capacity value changes under the influence of the parasitic capacitances C1 to C7 illustrated in FIG. 1.

Therefore, the power impedance of the through-vias 12 and 13 may be controlled by controlling the DC voltage applied between the through-via 14 and each of the substrate sections 10-3 and 10-4 by the variable power section 22 illustrated in FIG. 1.

Note that the DC voltage $V_{bias}$ applied between the through-via 14 and each of the substrate sections 10-3 and 10-4 may be controlled within a range in which the DC voltage is lower than a threshold Vth of the MOS structure including the substrate sections 10-3 and 10-4, the insulating layers 11 and the through-via 14.

The DC voltage $V_{bias}$ is set less than the threshold Vth of the MOS structure to avoid an operating region where the MOS structure allows currents when the DC voltage reaches the threshold Vth or more.

Figure 4:
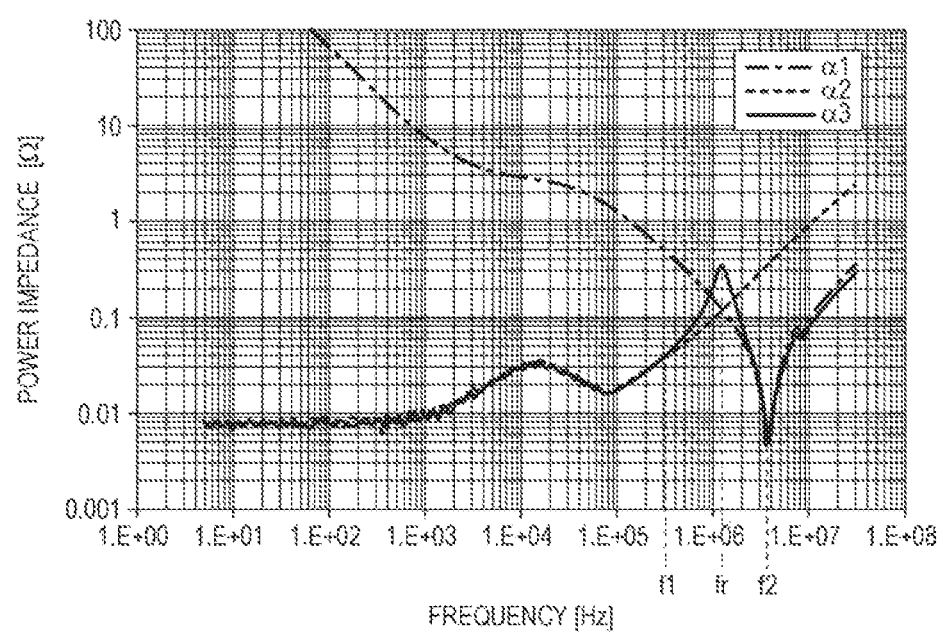
FIG. 4 is a graph illustrating an example of power impedance characteristics.

FIG. 4 is a graph illustrating an example of power impedance characteristics. The horizontal axis represents the frequency f (Hz) and the vertical axis represents the power impedance (Ω).

FIG. 4 illustrates a frequency characteristic $\alpha1$ of power impedance of a model equipped with an interposer having TSVs formed therein on a printed circuit board (PCB), a frequency characteristic $\alpha2$ of power impedance of a voltage regulator module (VRM) and a frequency characteristic $\alpha3$ obtained by combining the frequency characteristics $\alpha1$ and $\alpha2$.

The VRM is a model of a power module for supplying power to the model equipped with the interposer having the TSVs formed therein.

The frequency characteristic $\alpha3$ of the power impedance is approximately the same as the frequency characteristic $\alpha2$ of the power impedance of the VRM up to about 5 Hz to about $4 \times 10^5$ Hz. The reason why the frequency characteristics $\alpha2$ and $\alpha3$ become approximately the same as described above is because a low impedance characteristic attributable to a loop characteristic of the VRM and a large capacitor becomes dominant.

Moreover, when the frequency reaches about $4 \times 10^5$ Hz, a local maximum value is taken at about $1.3 \times 10^6$ Hz and a local minimum value is taken at about $5 \times 10^6$ Hz. The frequency is increased again at about $5 \times 10^6$ Hz. The reason why the frequency characteristic $\alpha3$ is shifted from the frequency characteristic $\alpha2$ is because the impedance characteristic attributable to a parasitic inductor and a parasitic capacitance of a substrate of the interposer becomes more dominant than the loop characteristic of the VRM.

The local maximum value of power impedance as described above is a peak caused by antiresonance. Hereinafter, the frequency at which the antiresonance occurs is referred to as the antiresonance frequency fr.

Here, in the through-vias 12 and 13, noise occurs due to an operation of an electronic circuit, an arithmetic processing unit or the like included in the semiconductor device 1 or due to an operation of an LSI chip or the like mounted in the semiconductor device 1. It is considered that, in most cases, there are some frequencies of the noise occurring in the through-vias 12 and 13 as described above. This is because noise of various frequencies may be generated by reflection and the like.

When the antiresonance occurs at the frequency of noise among the noise generated in the through-vias 12 and 13 that negatively affects the operation of the electronic circuit, the arithmetic processing unit or the like included in the semiconductor device 1, a malfunction may occur in the electronic circuit, the arithmetic processing unit or the like.

The same applies to the case where the antiresonance occurs at the frequency of noise that negatively affects an operation of a circuit which is a physically different circuit from the semiconductor device 1 and receives power from the through-vias 12 and 13 or a circuit which is a physically different circuit from the semiconductor device 1 and receives power from the same power supply source as that of the through-vias 12 and 13.

From the viewpoint of suppressing the malfunction due to antiresonance as described above, the upper limit is provided for the power impedance. This is because a malfunction may occur when the power impedance exceeds the upper limit. In FIG. 4, the upper limit Zt is 0.1Ω.

Thus, in order to perform stable power supply, it is very important to suppress the power impedance to the upper limit Zt or less at the frequency of the noise leading to the malfunction or the like when the antiresonance occurs among the noise generated in the through-vias 12 and 13.

Meanwhile, the power impedance characteristics may change in the frequency direction depending on operating conditions such as the operating frequency or temperature of the electronic circuit, the arithmetic processing unit or the like included in the semiconductor device 1, the LSI chip connected to the semiconductor device 1 or the like.

Moreover, the power impedance characteristics may change in the frequency direction depending on manufacturing variations in the semiconductor device 1 or manufacturing variations in the electronic circuit, the arithmetic processing unit, the LSI chip or the like, which receive power from the semiconductor device 1.

The change in the power impedance characteristics in the frequency direction means that the power impedance characteristics illustrated in FIG. 4 are shifted in the frequency direction, for example. When the power impedance characteristics are changed in the frequency direction, the power impedance may exceed the upper limit Zt at the frequency of the noise that may lead to the malfunction or the like when the antiresonance occurs.

Therefore, the semiconductor device 1 according to Embodiment 1 sets a frequency band of the noise that may lead to the malfunction or the like when the antiresonance occurs, and shifts the frequency characteristics of the power impedance in the frequency direction so that the power impedance does not exceed the upper limit Zt within the frequency band.

In order to shift the frequency characteristics of the power impedance in the frequency direction, the DC voltage to be applied to the through-via 14 is controlled. The power impedance of the through-vias 12 and 13 is adjusted by controlling the DC voltage to be applied to the through-via 14. Thus, the frequency characteristics of the power impedance are shifted in the frequency direction so that the power impedance does not exceed the upper limit Zt within the frequency band of the noise that may lead to the malfunction or the like when the antiresonance occurs.

Here, as an example, it is assumed that, around about $1 \times 10^6$ Hz, there are some frequencies of the noise that may lead to the malfunction or the like when the antiresonance occurs. It is also assumed that a frequency obtained by subtracting a frequency of a predetermined margin from the minimum value of such frequencies of the noise that may lead to the malfunction or the like is f1. Moreover, it is assumed that a frequency obtained by adding a frequency of a predetermined margin to the maximum value of such frequencies of the noise that may lead to the malfunction or the like is f2.

In the example illustrated in FIG. 4, the frequency f1 is about $3 \times 10^5$ Hz and the frequency f2 is about $3 \times 10^6$ Hz. Here, the band between the frequencies f1 and f2 is referred to as the avoidance band.

The frequency characteristics of the power impedance illustrated in FIG. 4 exceed the upper limit Zt within the avoidance band, and the antiresonance peak is within the avoidance band.

In order to suppress the frequency characteristics of the power impedance of the through-vias 12 and 13, the power layer (V plane) and the ground layer (G plane) from ending up in a situation as illustrated in FIG. 4, the semiconductor device 1 controls the DC voltage to be applied to the through-via 14 and controls the value of the power impedance within the avoidance band such that the value is equal to or less than the upper limit Zt.

Figure 5:
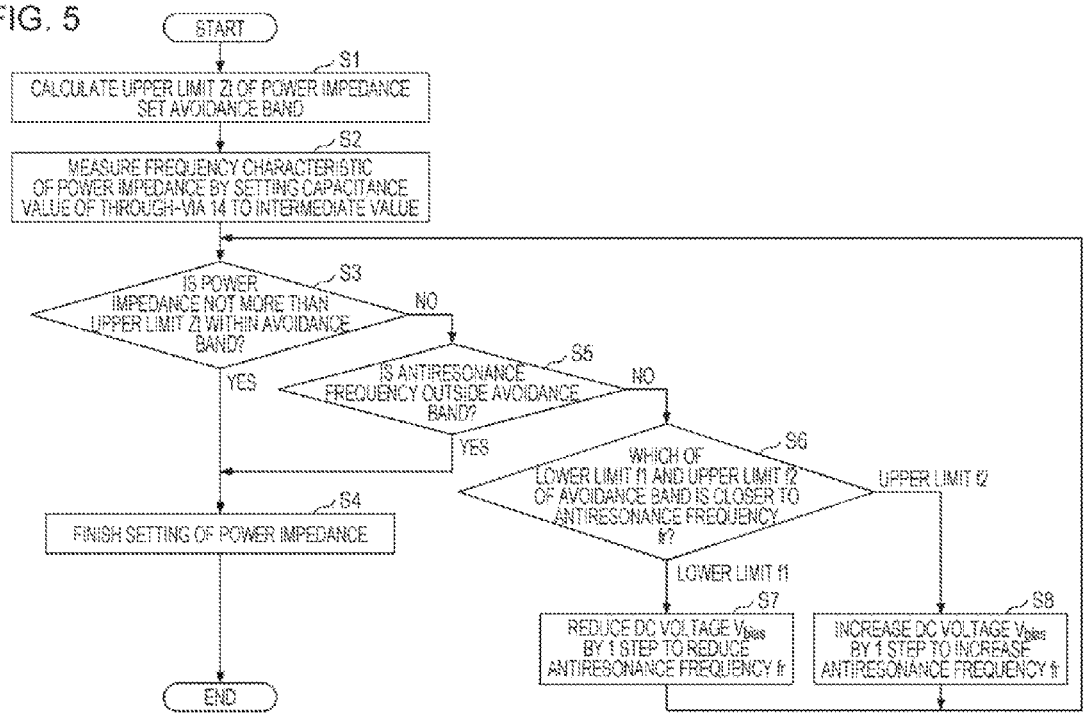
FIG. 5 is a flowchart illustrating control processing executed by a control section in the semiconductor device.

FIG. 5 is a flowchart illustrating control processing executed by the control section 20 in the semiconductor device 1. FIG. 6 is a diagram illustrating the voltage value data 25A.

The control section 20 starts upon receipt of an instruction to start the control processing (Start).

The control section 20 sets an avoidance band by calculating the upper limit Zt of the power impedance (Step S1).

The upper limit Zt of the power impedance is calculated using Equation (2) as follows:

$$Zt=(Vcc \times \text{ripple factor})/(50\% \times Imax) \quad (2)$$

In Equation (2), Vcc represents a power-supply voltage, and Imax represents a maximum consumption current. The value of the maximum consumption current Imax may be pre-calculated based on the specifications of the electronic circuit, the arithmetic processing unit or the like included in the semiconductor device 1 or of the LSI chip and the like connected to the semiconductor device 1. Note that the data indicating the upper limit Zt of the power impedance may be stored in the memory 25.

The avoidance band may also be pre-calculated based on the specifications of the electronic circuit, the arithmetic processing unit or the like included in the semiconductor device 1 or of the LSI chip and the like connected to the semiconductor device 1.

The control section 20 measures the frequency characteristics of the power impedance by setting the capacitance value of the through-via 14 to an intermediate value (Step S2).

Referring to the voltage value data 25A illustrated in FIG. 6, the control section 20 sets the capacitance value of the through-via 14 to the intermediate value by setting the output voltage value of the variable power section 22 to an intermediate value between the upper limit Vmax and the lower limit Vmin of a range within which the voltage control section 24 may adjust the output voltage value. This is because the intermediate value of the output voltage value of the variable power section 22 corresponds to the intermediate value of the capacitance value of the through-via 14.

In Step S2, the measuring section 21 measures the power impedance frequency characteristics by measuring reflection coefficients (S parameter) at the through-vias 12 and 13 while outputting a sine-wave signal and sweeping the frequency of the sine-wave signal. As a result, the power impedance frequency characteristics as illustrated in FIG. 4, for example, are obtained, and thus the antiresonance frequency fr is determined.

Next, the control section 20 determines whether the power impedance value is equal to or less than the upper limit Zt within the avoidance band (Step S3). As for the value of the upper limit Zt, the value calculated in Step S1 may be used.

When determining that the power impedance value is equal to or less than the upper limit Zt within the avoidance band (S3: YES), the control section 20 finishes setting of the power impedance (Step S4). This is because the semiconductor device 1 may perform good-quality power supply since the power impedance value is equal to or less than the upper limit Zt within the avoidance band.

On the other hand, when determining that the power impedance value is higher than the upper limit Zt within the avoidance band (S3:NO), the control section 20 determines whether the antiresonance frequency fr is outside the avoidance band (Step S5).

The processing of Step S5 is processing of determining whether the value of the antiresonance frequency fr determined by obtaining the power impedance frequency characteristics in Step S2 is equal to or greater than the lower limit f1 of the avoidance band and equal to or less than the upper limit f2 thereof.

When determining that the antiresonance frequency fr is outside the avoidance band (S5: YES), the control section 20 advances the flow to Step S4 and finishes setting of the power impedance. This is because the control section 20 determines that the capacitance of the through-via 14 does not have to be adjusted if no antiresonance occurs within the avoidance band even when the power impedance value is higher than the upper limit Zt within the avoidance band.

When determining that the antiresonance frequency fr is not outside the avoidance band (S5: NO), the control section 20 determines which one of the lower limit f1 and the upper limit f2 of the avoidance band is close to the antiresonance frequency fr (Step S6).

The processing of Step S6 is processing of determining which one of a difference between the value of the antiresonance frequency fr and the lower limit f1 of the avoidance band, and a difference between the antiresonance frequency fr and the upper limit f1 is smaller, the antiresonance frequency fr being determined by obtaining the power impedance frequency characteristics in Step S2.

When determining that the antiresonance frequency fr is close to the lower limit f1 of the avoidance band, the control section 20 decreases the DC voltage $V_{bias}$ by 1 step to reduce the antiresonance frequency fr (Step S7).

Here, 1 step of the DC voltage $V_{bias}$ may be set to a voltage value for changing the capacitance of the through-via 14 to divide the range between the lower limit f1 and the upper limit f2 of the avoidance band into ten sections, for example, and to shift the power impedance characteristics in the frequency direction by $1/10$ of the length of the avoidance band.

By executing the processing of Step 7, the power impedance frequency characteristics measured in Step 2 are shifted to the lower frequency side by $1/10$ of the length of the avoidance band.

On the other hand, when determining that the antiresonance frequency fr is close to the upper limit f2 of the avoidance band, the control section 20 increases the DC voltage $V_{bias}$ by 1 step to increase the antiresonance frequency fr (Step S8).

1 step of the DC voltage $V_{bias}$ is the same as the voltage value in Step S7. By executing the processing of Step S8, the power impedance frequency characteristics measured in Step 2 are shifted to the higher frequency side by $1/10$ of the length of the avoidance band.

Upon completion of the processing of Step S7 or S8, the control section 20 advances the flow to Step S3. Then, the control section 20 determines again in Step S3 whether the power impedance value is equal to or less than the upper limit Zt within the avoidance band, and continues the processing until finally reaching Step S4.

When the processing of Step S4 is completed, the power impedance value is equal to or less than the upper limit Zt within the avoidance band, or no antiresonance occurs within the avoidance band even when the power impedance value exceeds the upper limit Zt within the avoidance band.

Thus, the semiconductor device 1 may perform good-quality power supply.

As described above, according to Embodiment 1, the capacitance of the through-via 14 is set such that the power impedance value is equal to or less than the upper limit Zt within the avoidance band including the frequency of the noise that may lead to the malfunction or the like when the antiresonance occurs, or such that no antiresonance occurs within the avoidance band even when the power impedance value exceeds the upper limit Zt within the avoidance band.

By setting the capacitance of the through-via 14 as described above, the semiconductor device 1 capable of good-quality power supply may be provided.

Moreover, the semiconductor device 1 according to Embodiment 1 may adjust the power impedance of the through-vias 12 and 13 by controlling the DC voltage to be applied to the through-via 14 without using a bypass capacitor.

Therefore, the semiconductor device 1 is particularly useful in the case of high-density mounting.

Furthermore, more detailed setting may be made since the power impedance may be set based on manufacturing variations in the electronic circuit, the arithmetic processing unit or the like included in the semiconductor device 1 or the LSI chip and the like connected to the semiconductor device 1.

Note that the above description is given of the embodiment in which the control section 20 includes the measuring section 21, the variable power section 22, the determination section 23, the voltage control section 24 and the memory 25. However, the variable power section 22 may be formed on the substrate 10 so as to be positioned outside the control section 20.

Figure 7:
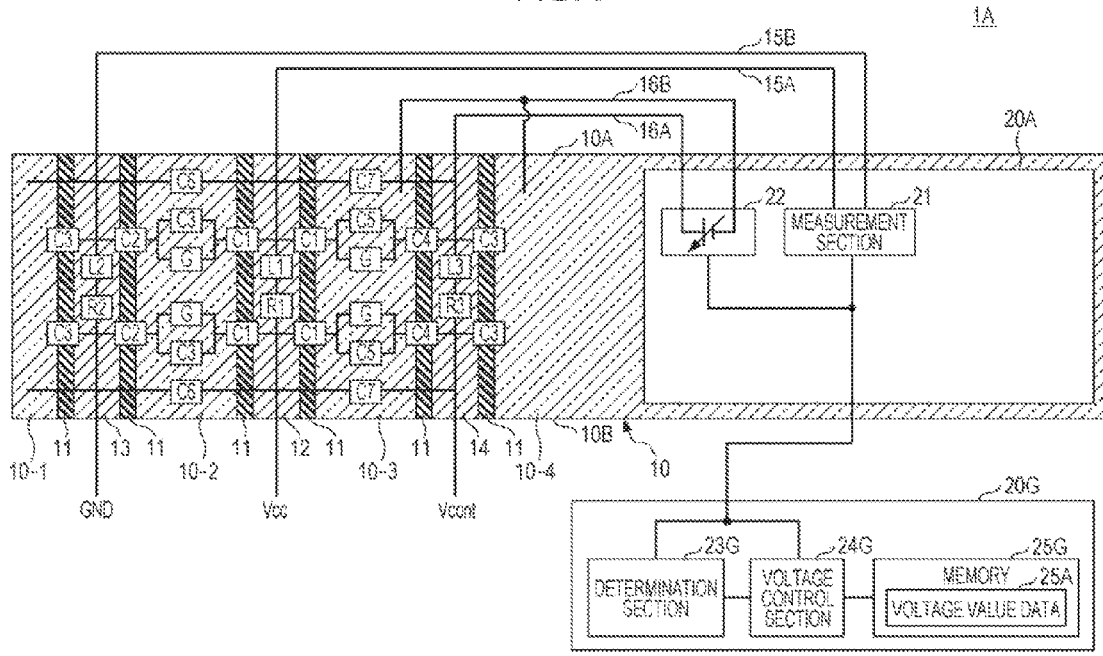
FIG. 7 is a cross-sectional view illustrating a semiconductor device according to a modified example of Embodiment 1.

Moreover, although the above description is given of the embodiment in which the control section 20 includes the measuring section 21, the variable power section 22, the determination section 23, the voltage control section 24 and the memory 25, a modification may be made as illustrated in FIG. 7.

FIG. 7 is a cross-sectional view illustrating a semiconductor device 1A according to a modified example of Embodiment 1.

The semiconductor device 1A includes a substrate 10, insulating layers 11, through-vias 12, 13 and 14, wires 15A, 15B, 16A and 16B, and an adjustment section 20A. The adjustment section 20A includes a measuring section 21 and a variable power section 22.

The semiconductor device 1A illustrated in FIG. 7 has a configuration obtained by changing the control section 20 in the semiconductor device 1 illustrated in FIG. 1 to the adjustment section 20A. A controller 20G including a determination section 23G, a voltage control section 24G and a memory 25G is connected to the semiconductor device 1A.

The controller 20G is obtained by providing the determination section 23, the voltage control section 24 and the memory 25 in the control section 20 in the semiconductor device 1 illustrated in FIG. 1 outside the semiconductor device 1 as a controller. The determination section 23G, the voltage control section 24G and the memory 25G are the same as the determination section 23, the voltage control section 24 and the memory 25, respectively.

The controller 20G including the determination section 23G, the voltage control section 24G and the memory 25G is connected to the semiconductor device 1A, thereby performing power impedance setting in the same manner as the semiconductor device 1 illustrated in FIG. 1.

Figure 8:
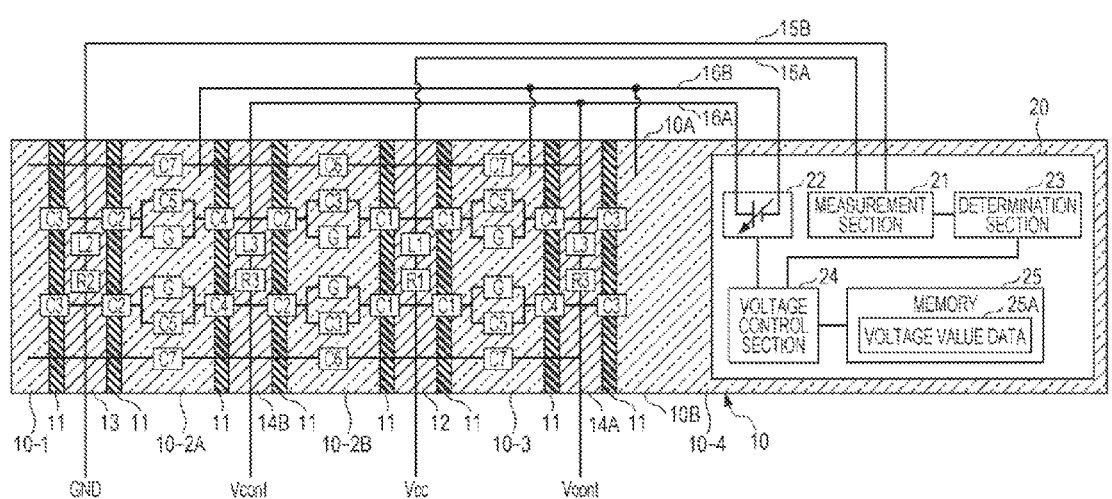
FIG. 8 is a cross-sectional view illustrating a semiconductor device according to a modified example of Embodiment 1.

Alternatively, a modification may be made as illustrated in FIG. 8.

FIG. 8 is a cross-sectional view illustrating a semiconductor device 1B according to a modified example of Embodiment 1.

The semiconductor device 1B includes a substrate 10, insulating layers 11, through-vias 12, 13, 14A and 14B, wires 15A, 15B, 16A and 16B, and a control section 20.

The substrate 10 is divided into substrate sections 10-1, 10-2A, 10-2B, 10-3 and 10-4 in the cross-section illustrated in FIG. 8, but are connected and integrated in a plan view.

The semiconductor device 1B has a configuration in which the through-via 14B is added between the through-vias 12 and 13 in the semiconductor device 1 illustrated in FIG. 1. The through-via 14A corresponds to the through-via 14 in FIG. 1. The through-via 14B is the same as the through-via 14A and connected to the variable power section 22 through the wires 16A and 16B.

In the semiconductor device 1B, the through-vias 14A and 14B are provided corresponding to the through-vias 12 and 13, respectively.

Such a configuration allows more effective control of the value of power impedance of the through-vias 12 and 13.

Figure 9:
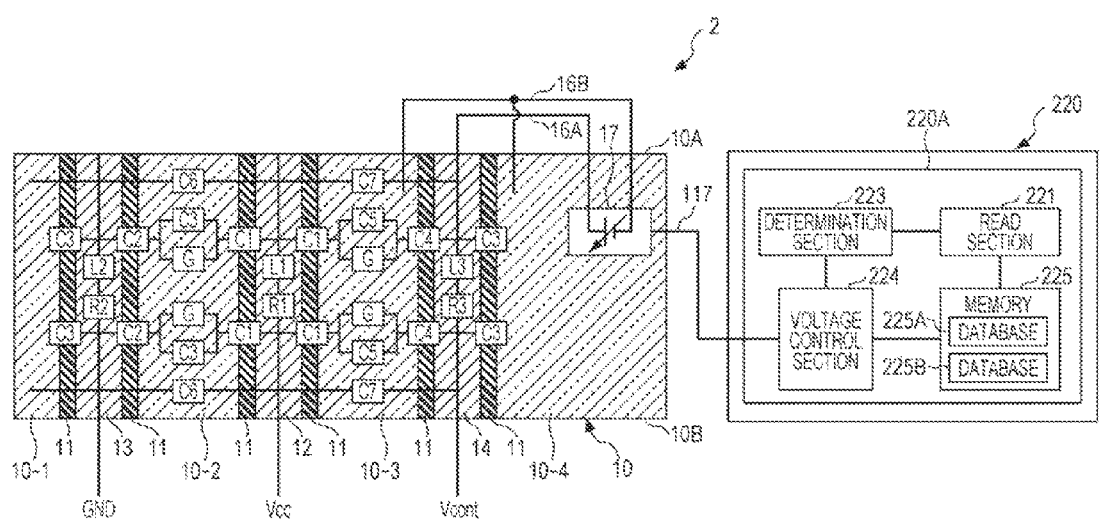
FIG. 9 is a cross-sectional view illustrating a semiconductor device according to Embodiment 2.

FIG. 9 is a cross-sectional view illustrating a semiconductor device 2 according to Embodiment 2.

The semiconductor device 2 illustrated in FIG. 9 includes a substrate 10, insulating layers 11, through-vias 12, 13 and 14, and a variable power section 17. A controller 220 is connected to the variable power section 17 in the semiconductor device 2 through a cable 117.

The semiconductor device 2 has a configuration obtained by removing the wires 15A, 15B, 16A and 16B and the control section 20 from the semiconductor device 1 according to Embodiment 1 and providing the variable power section 17, which is the same as the variable power section 22, in the substrate 10.

The insulating layers 11 and the through-vias 12, 13 and 14 are the same as the insulating layers 11 and the through-vias 12, 13 and 14 in Embodiment 1. Also, the substrate 10 according to Embodiment 2 is the same as the substrate 10 according to Embodiment 1 except that the wires 15A, 15B, 16A and 16B and the control section 20 are not formed and the variable power section 17 is formed instead.

The controller 220 may be a personal computer (PC), for example, and includes a read section 221, a determination section 223, a voltage control section 224 and a memory 225 in a control section 220A. The determination section 223 and the voltage control section 224 are the same as the determination section 23 and the voltage control section 24 in the control section in the semiconductor device 1 according to Embodiment 1, respectively.

Also, the memory 225 is different from the memory 25 according to Embodiment 1 in storing databases 225A and 225B.

The controller 220 uses an analysis model to obtain a voltage value to be finally set in the variable power section 17 by the controller 220. Then, the controller 220 sets the obtained voltage value in the variable power section 17 in the semiconductor device 2.

The variable power section 17 is a variable DC power in which a value of a DC voltage to be output is set by the controller 220 connected through the cable 117.

The cable 117 is a cable connecting the semiconductor device 2 to the controller 220. As the cable 117, a peripheral component interconnect (PCI) cable is available. The cable 117 is used when the controller 220 finally sets a voltage value in the through-via 14. Thus, the controller 220 does not have to be connected to the semiconductor device 2 through the cable 117 until a final voltage value is obtained.

Here, prior to description of each of the constituent elements in the controller 220, the analysis model is described.

Figure 10:
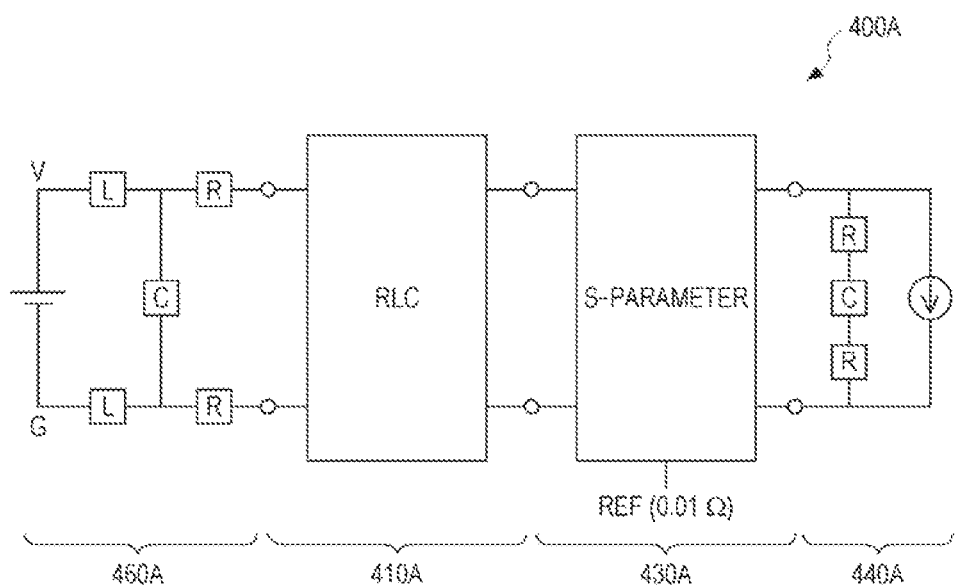
FIG. 10 is a diagram illustrating an example of an electronic device model used in Embodiment 2.

FIG. 10 is a diagram illustrating an example of an electronic device model used in Embodiment 2.

A model 400A illustrated in FIG. 10 includes a VRM section 460A corresponding to the VRM in the semiconductor device 2 and a PCB section 410A corresponding to the substrate 10.

A TSV section 430A corresponds to the through-vias 12, 13 and 14. A DC voltage to be applied to the through-via 14 may be set by the variable DC power corresponding to the variable power section 22. A load section 440A is a load to which power is supplied from the semiconductor device 2.

Note that, in FIG. 10, R represents resistance, L represents inductance, and C represents capacitance.

Characteristics of the TSV section 430A between the PCB section 410A and the load section 440A in the model 400A may be expressed by S parameters (transmission coefficient and reflection coefficient). The S parameters may change according to the DC voltage applied to the TSV section 430A corresponding to the through-via 14. The S parameters of the TSV section 430A may be acquired by simulation using the model 400A or acquired by measurement using a network analyzer in the semiconductor device 2. The power impedance of input and output of the TSV section 430A may be obtained by using the S parameters.

Next, description is given of each of the constituent elements in the controller 220 illustrated in FIG. 9.

The read section 221 reads data indicating the frequency characteristics of the power impedance stored in the database 225A when the power impedance is obtained using the model 400A. The data indicating the frequency characteristics of the power impedance stored in the database 225A is data indicating frequency characteristics of power impedance, which is created using the model 400A. The data indicating the frequency characteristics of the power impedance is data indicating a value of the power impedance versus the frequency as in the case of the frequency characteristics of the power impedance illustrated in FIG. 4.

The determination section 223 determines whether the power impedance value exceeds a predetermined upper limit in the frequency characteristics of the power impedance shifted in the frequency direction when the DC voltage applied to the TSV section 430A corresponding to the through-via 14 is changed. The determination section 223 transmits a signal indicating the determination result to the voltage control section 224.

The voltage control section 224 controls the DC voltage applied to the TSV section 430A corresponding to the through-via 14, based on the signal indicating the determination result from the determination section 223.

The memory 225 stores the database used to control the DC voltage applied to the TSV section 430A corresponding to the through-via 14 by the voltage control section 224. As for the memory 225, a non-volatile memory may be used, for example. The memory 225 stores the databases 225A and 225B.

The database 225A stores the data indicating the frequency characteristics of the power impedance, which is created using the analysis model prepared based on the specifications of the semiconductor device 2. The data indicating the frequency characteristics of the power impedance is data indicating a value of the power impedance versus the frequency as in the case of the frequency characteristics of the power impedance illustrated in FIG. 4.

The database 225B stores data indicating a capacitance value of a parasitic capacitance $C_{depl}$ versus the bias voltage. This is data indicating a relationship between the bias voltage and the capacitance value of the parasitic capacitance $C_{depl}$ described with reference to FIGS. 2 and 3 in Embodiment 1.

In Embodiment 2, data indicating a capacitance value of a parasitic capacitance $C_{depl}$ versus the bias voltage is prepared to shift the frequency characteristics of the power impedance in the frequency direction by changing the bias voltage using the model of the semiconductor device 2 prepared for analysis.

The capacitance value of the parasitic capacitance $C_{depl}$ corresponding to the bias voltage is obtained using the data indicating the capacitance value of the parasitic capacitance $C_{depl}$ versus the bias voltage stored in the database 225B. Then, the obtained capacitance value of the parasitic capacitance $C_{depl}$ is applied to the frequency characteristics of the power impedance read by the read section 221, thereby shifting the frequency characteristics of the power impedance in the frequency direction.

Note that the controller 220 including the read section 221, the determination section 223, the voltage control section 224 and the memory 225 as described above may be formed in the substrate 10 by using the semiconductor manufacturing technology.

Figure 11:
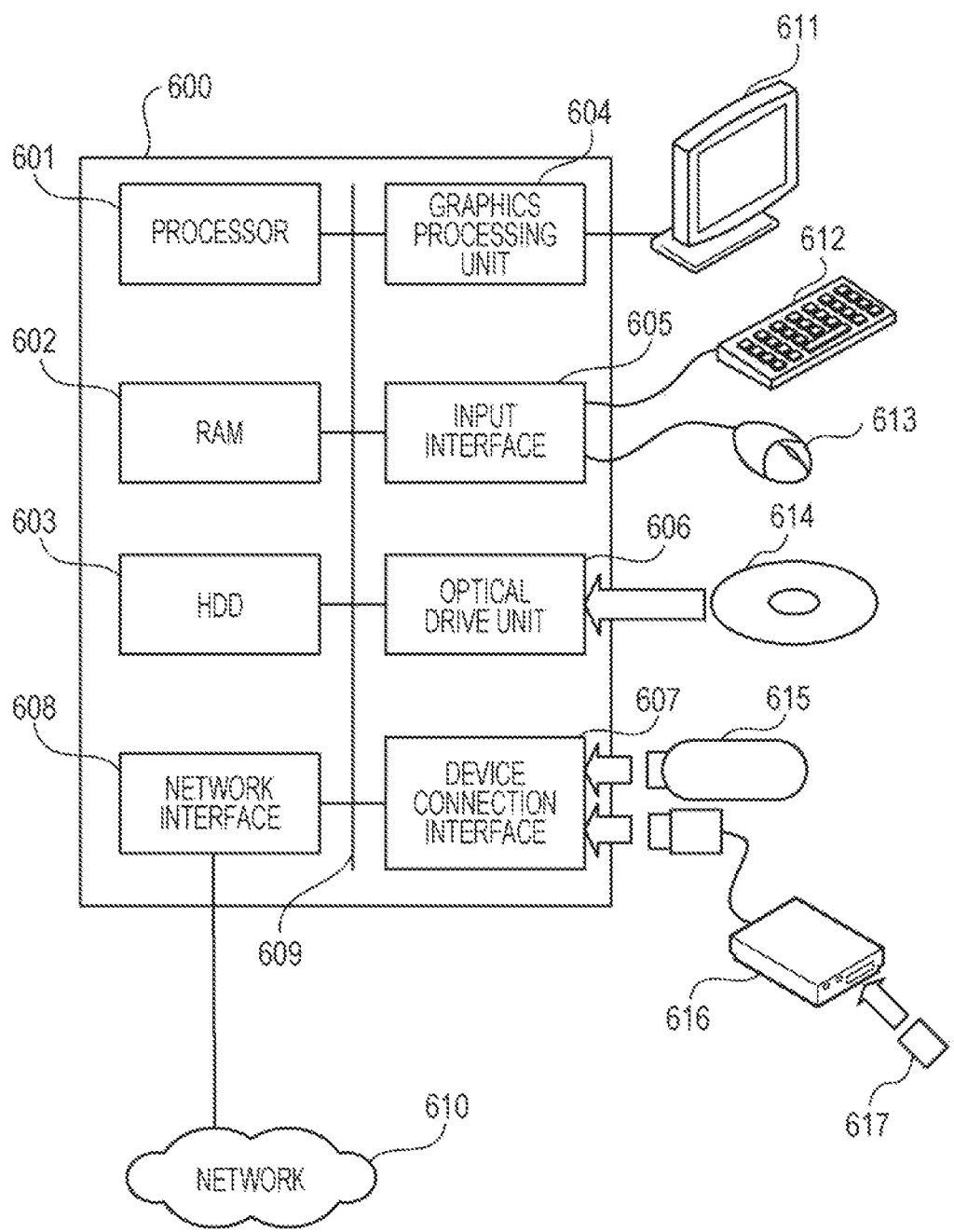
FIG. 11 is a diagram illustrating a hardware configuration example of a computer used as a controller.

FIG. 11 is a diagram illustrating a hardware configuration example of a computer used as the controller 220.

A computer 600 is entirely controlled by a processor 601. A random access memory (RAM) 602 and peripheral devices are connected to the processor 601 via a bus 609. The processor 601 is, for example, a central processing unit (CPU), a micro-processing unit (MPU), a digital signal processor (DSP), an application-specific integrated circuit (ASIC) or a programmable logic device (PLD). Alternatively, the processor 601 may be a combination of two or more kinds of elements among the CPU, MPU, DSP, ASIC and PLD.

A RAM 602 may be used as a main storage device of the computer 600. The RAM 602 temporarily stores at least a part of an operating system (OS) program or an application program to be executed by the processor 601. The RAM 602 also stores various data prepared for processing by the processor 601.

Peripheral devices connected to a bus 609 include a hard disk drive (HDD) 603, a graphics processing unit 604, an input interface 605, an optical drive unit 606, a device connection interface 607 and a network interface 608.

The HDD 603 magnetically writes and reads data into and from a built-in disk. The HDD 603 is used as an auxiliary storage device of the computer 600. The HDD 603 stores the OS program, the application program and various data. Note that a semiconductor storage device such as a flash memory may also be used as the auxiliary storage device.

A monitor 611 is connected to the graphics processing unit 604. The graphics processing unit 604 displays images on a screen of the monitor 611 according to an instruction from the processor 601. Examples of the monitor 611 include a display device, a liquid crystal display device or the like using a cathode ray tube (CRT).

A keyboard 612 and a mouse 613 are connected to the input interface 605. The input interface 605 transmits a signal sent from the keyboard 612 or the mouse 613 to the processor 601. Note that the mouse 613 is an example of a pointing device, and another pointing device may also be used. Examples of the pointing device include a touch panel, a tablet, a touch pad, a track ball and the like.

The optical drive unit 606 reads data recorded on an optical disk 614 by using a laser beam or the like. The optical disk 614 is a portable recording medium having data recorded thereon as readable by reflection of light. Examples of the optical disk 614 include a digital versatile disc (DVD), a DVD-RAM, a compact disc read only memory (CD-ROM), a compact disc recordable/rewritable and the like.

The device connection interface 607 is a communication interface for connecting peripheral devices to the computer 600. For example, a memory unit 615 and a memory reader/writer 616 may be connected to the device connection interface 607. The memory unit 615 is a recording medium equipped with a communication function with the device connection interface 607. The memory reader/writer 616 is a device configured to write data into a memory card 617 and to read data from the memory card 617. The memory card 617 is a card-type recording medium.

The network interface 608 is connected to a network 610. The network interface 608 transmits and receives data to and from another computer or a communication device through the network 610.

The hardware configuration as described above may provide processing functions of the controller 220.

The computer 600 provides the processing functions of the controller 220 by executing a program recorded in a computer-readable recording medium, for example. A program describing processing contents to be executed by the computer 600 may be recorded in various recording media. For example, a program to be executed by the computer 600 may be stored in the HDD 603. The processor 601 executes the program by loading at least a part of the program in the HDD 603 onto the RAM 602. Alternatively, the program to be executed by the computer 600 may also be recorded in a portable recording medium such as the optical disk 614, the memory unit 615 and the memory card 617. The program stored in the portable recording medium becomes executable after being installed into the HDD 603 under control of the processor 601, for example. Alternatively, the program may be read directly from the portable recording medium and executed.

Figure 12:
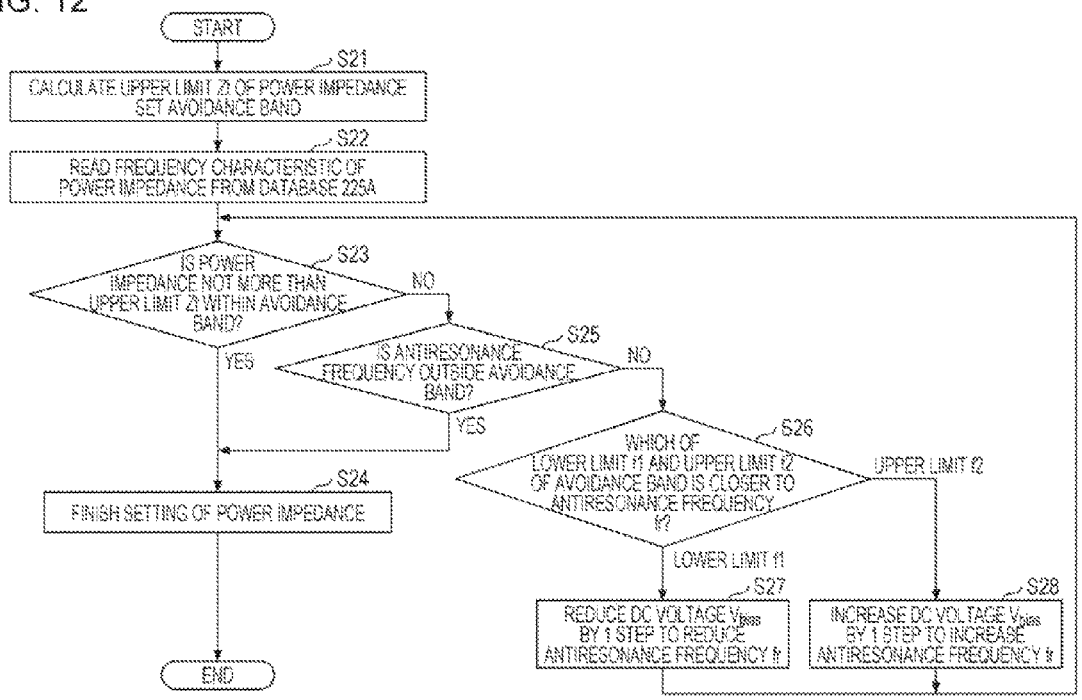
FIG. 12 is a flowchart illustrating control processing executed by the controller connected to the semiconductor device.

FIG. 12 is a flowchart illustrating control processing executed by the controller 220 connected to the semiconductor device 2. FIG. 13 is a diagram illustrating data stored in the database 225B, the data indicating the capacitance value of the parasitic capacitance $C_{depl}$ versus the bias voltage $V_{bias}$.

The controller 220 starts upon receipt of an instruction to start the control processing (Start).

The controller 220 sets an avoidance band by calculating an upper limit Zt of power impedance (Step S21). The processing of Step S21 is the same as the processing of Step S1 in Embodiment 1.

The controller 220 reads frequency characteristics of the power impedance from the database 225A (Step S22).

The database 225A pre-stores data indicating the frequency characteristics of the power impedance, which is created using the analysis model prepared based on the specifications of the semiconductor device 2. The data indicating the frequency characteristics of the power impedance is data indicating a value of the power impedance versus the frequency as in the case of the frequency characteristics of the power impedance illustrated in FIG. 4. Note that the data indicating the frequency characteristics of the power impedance stored in the database 225A includes data indicating the antiresonance frequency fr.

Next, the controller 220 determines whether the power impedance value is equal to or less than the upper limit Zt within the avoidance band (Step S23). As for the value of the upper limit Zt, the value calculated in Step S21 may be used.

When determining that the power impedance value is equal to or less than the upper limit Zt within the avoidance band (S23: YES), the controller 220 finishes setting of the power impedance (Step S24). This is because the semiconductor device 2 may perform good-quality power supply since the power impedance value is equal to or less than the upper limit Zt within the avoidance band.

In this case, the semiconductor device 2 and the controller 220 are connected by the cable 117 to set the finally obtained voltage value to the through-via 14.

On the other hand, when determining that the power impedance value is higher than the upper limit Zt within the avoidance band (S23: NO), the controller 220 determines whether the antiresonance frequency fr is outside the avoidance band (Step S25).

The processing of Step S25 is processing of determining whether the value of the antiresonance frequency fr determined by obtaining the power impedance frequency characteristics in Step S22 is equal to or greater than the lower limit f1 of the avoidance band and equal to or less than the upper limit f2 thereof.

When determining that the antiresonance frequency fr is outside the avoidance band (S25: YES), the controller 220 advances the flow to Step S24 and finishes setting of the power impedance. This is because the controller 220 determines that the capacitance of the through-via 14 does not have to be adjusted if no antiresonance occurs within the avoidance band even when the power impedance value is higher than the upper limit Zt within the avoidance band.

When determining that the antiresonance frequency fr is not outside the avoidance band (S25: NO), the controller 220 determines which one of the lower limit f1 and the upper limit f2 of the avoidance band is close to the antiresonance frequency fr (Step S26).

The processing of Step S26 is processing of determining which one of a difference between the value of the antiresonance frequency fr and the lower limit f1 of the avoidance band, and a difference between the antiresonance frequency fr and the upper limit f1 is smaller, the antiresonance frequency fr being determined by obtaining the power impedance frequency characteristics in Step S22.

When determining that the antiresonance frequency fr is close to the lower limit f1 of the avoidance band, the controller 220 decreases the DC voltage $V_{bias}$ by 1 step to reduce the antiresonance frequency fr (Step S27).

Here, 1 step of the DC voltage $V_{bias}$ may be set to a voltage value for changing the capacitance of the through-via 14 to divide the range between the lower limit f1 and the upper limit f2 of the avoidance band into ten sections, for example, and to shift the power impedance characteristics in the frequency direction by 1/10 of the length of the avoidance band.

By executing the processing of Step S27, the power impedance frequency characteristics measured in Step S22 are shifted to the lower frequency side by 1/10 of the length of the avoidance band.

Moreover, in Step S27, a total capacity C is calculated using Equation (1) and the data indicating the capacitance value of the parasitic capacitance $C_{depl}$ versus the bias voltage $V_{bias}$, which is stored in the database 225B, and the frequency characteristics of the power impedance are shifted in the frequency direction.

On the other hand, when determining that the antiresonance frequency fr is close to the upper limit f2 of the avoidance band, the controller 220 increases the DC voltage $V_{bias}$ by 1 step to increase the antiresonance frequency fr (Step S28).

1 step of the DC voltage $V_{bias}$ is the same as the voltage value in Step S27. By executing the processing of Step S28, the power impedance frequency characteristics measured in Step S22 are shifted to the higher frequency side by ⅒ of the length of the avoidance band.

Moreover, in Step S28, a total capacity C is calculated using Equation (1) and data indicating the capacitance value of the parasitic capacitance $C_{depl}$ versus the bias voltage $V_{bias}$, which is stored in the database 225B, and the frequency characteristics of the power impedance are shifted in the frequency direction.

Upon completion of the processing of Step S27 or S28, the controller 220 advances the flow to Step S23. Then, the controller 220 determines again in Step S23 whether the power impedance value is equal to or less than the upper limit Zt within the avoidance band, and continues the processing until finally reaching Step S24.

When the processing of Step S24 is completed, the power impedance value is equal to or less than the upper limit Zt within the avoidance band, or no antiresonance occurs within the avoidance band even when the power impedance value exceeds the upper limit Zt within the avoidance band.

Thus, the semiconductor device 2 may perform good-quality power supply.

As described above, according to Embodiment 2, the capacitance of the through-via 14 is set such that the power impedance value is equal to or less than the upper limit Zt within the avoidance band including the frequency of the noise that may lead to the malfunction or the like when the antiresonance occurs, or such that no antiresonance occurs within the avoidance band even when the power impedance value exceeds the upper limit Zt within the avoidance band.

By setting the capacitance of the through-via 14 as described above, the semiconductor device 2 capable of good-quality power supply may be provided.

Moreover, the semiconductor device 2 according to Embodiment 2 may adjust the power impedance of the through-vias 12 and 13 by controlling the DC voltage to be applied to the through-via 14 without using a bypass capacitor.

Therefore, the semiconductor device 2 is particularly useful in the case of high-density mounting.

Furthermore, more detailed setting may be made since the power impedance may be set based on manufacturing variations in the electronic circuit, the arithmetic processing unit or the like included in the semiconductor device 2 or the LSI chip and the like connected to the semiconductor device 2.

The semiconductor devices and the method for setting a voltage in the semiconductor devices according to the exemplary embodiments have been described above. However, the embodiments are not limited to those specifically disclosed, and various modifications and changes may be made without departing from the scope of claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device, comprising:
   a substrate;
   a first through-electrode penetrating the substrate and connected to a power source or a reference potential point;
   a second through-electrode penetrating the substrate;
   a power section connected between the substrate and the second through-electrode and configured to output a DC voltage between the substrate and the second through-electrode;
   a voltage control section configured to control the DC voltage to be output by the power section; and
   a measurement section connected to the first through-electrode and configured to measure a power impedance of the first through-electrode, wherein
   the voltage control section is configured to control a value of the DC voltage output by the power section, such that the power impedance of the first through-electrode measured by the measurement section is equal to or less than a predetermined value within a predetermined frequency range including a frequency of noise occurring in the first through-electrode.

2. The semiconductor device according to claim 1, wherein
   when there is a frequency region where the power impedance of the first through-electrode is more than the predetermined value, the voltage control section determines whether an antiresonance frequency at which antiresonance of the power impedance occurs is included in the predetermined frequency range, and
   when the antiresonance frequency is included in the predetermined frequency range, the voltage control section changes the value of the DC voltage output by the power section such that the antiresonance frequency is outside the predetermined frequency range.

3. The semiconductor device according to claim 2, wherein the voltage control section
   causes the power section to increase the value of the DC voltage when the antiresonance frequency is included in the predetermined frequency range and is closer to a second frequency as an upper limit of the predetermined frequency range than a first frequency as a lower limit of the predetermined frequency range, and
   causes the power section to decrease the value of the DC voltage when the antiresonance frequency is included in the predetermined frequency range and is closer to the first frequency than the second frequency.

4. The semiconductor device according to claim 1, further comprising: insulating layers being configured to penetrate the substrate and provided on sides of the first and second through-electrodes.

5. A semiconductor device, comprising:
   a substrate;
   a first through-electrode penetrating the substrate and connected to a power source or a reference potential point;
   a second through-electrode penetrating the substrate; and
   a power section connected between the substrate and the second through-electrode and configured to output a DC voltage between the substrate and the second through-electrode, wherein
   a value of the DC voltage is selectively set such that a power impedance of the first through-electrode is equal to or less than a predetermined value within a frequency range in which resonance is to be avoided, and which includes a frequency of noise caused by resonance occurring in the first through-electrode.

6. The semiconductor device according to claim 1, wherein the power impedance of the first through-electrode is set to equal to or less than the predetermined value within the predetermined frequency range including the frequency of the noise occurring in the first through-electrode, in such a way that a thickness of a depletion layer generated in the insulating layer is adjusted by controlling the DC voltage applied between the substrate and the second through-electrode.

7. The semiconductor device according to claim 1, wherein the first and second through-electrodes are TSVs.

8. A method for setting a voltage in a semiconductor device which includes
- a substrate,
- a first through-electrode penetrating the substrate and connected to a power source or a reference potential point,
- a second through-electrode penetrating the substrate, and
- a power section connected between the substrate and the second through-electrode and configured to output a DC voltage between the substrate and the second through-electrode, and
- in which a DC voltage output by the power section in the semiconductor device is set by a computer,
- the method comprising setting a value of the DC voltage such that a power impedance of the first through-electrode is equal to or less than a predetermined value within a frequency range in which resonance is to be avoided, and which includes a frequency of noise caused by resonance occurring in the first through-electrode.

* * * * *